United States Patent

[11] 3,586,991

[72] Inventor Robert E. Vosteen
315 W. Center St., Medina, N.Y. 14103

[21] Appl. No. 759,914
[22] Filed Sept. 16, 1968
[45] Patented June 22, 1971

[54] OVERLOAD PROTECTION CIRCUIT FOR AMPLIFIER
10 Claims, 3 Drawing Figs.

[52] U.S. Cl. .......... 330/207 P, 330/110, 307/202
[51] Int. Cl. .......... H03f 21/00
[50] Field of Search .......... 330/11 P, 110, 142; 307/202, 318

[56] References Cited
UNITED STATES PATENTS

| | | | |
|---|---|---|---|
| 3,047,742 | 7/1962 | Greening et al. .......... | 307/318 X |
| 3,083,303 | 3/1963 | Knowles et al. .......... | 307/202 X |
| 3,191,101 | 6/1965 | Reszka .......... | 307/318 X |
| 3,252,051 | 5/1966 | Walker .......... | 307/318 X |

*Primary Examiner*—Nathan Kaufman
*Attorney*—Irons, Stockman, Sears and Santorelli

ABSTRACT: An overload protection circuit for an amplifier wherein the operational potential of elements comprising the amplifier are limited to a value less than their destruction potential. The protection circuit employs zener diodes or elements having similar characteristics connected to the amplifier to preclude the application of potentials thereto that are capable of destroying elements comprising the amplifier.

FIG. 1.
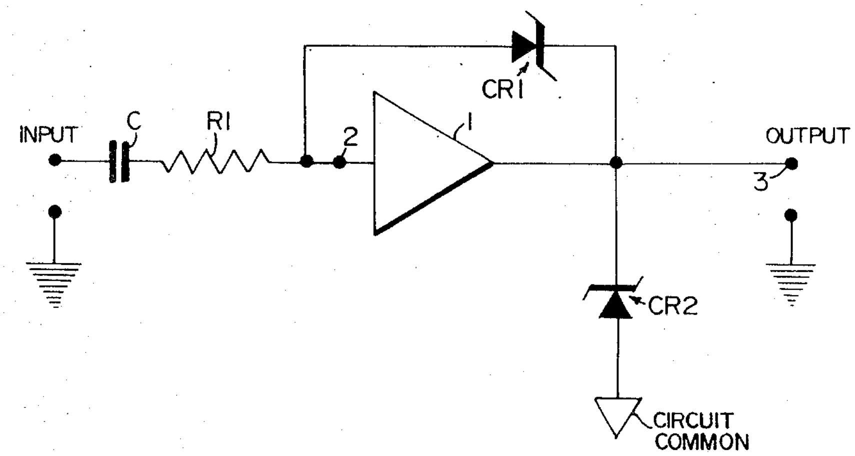
FIG. 2.
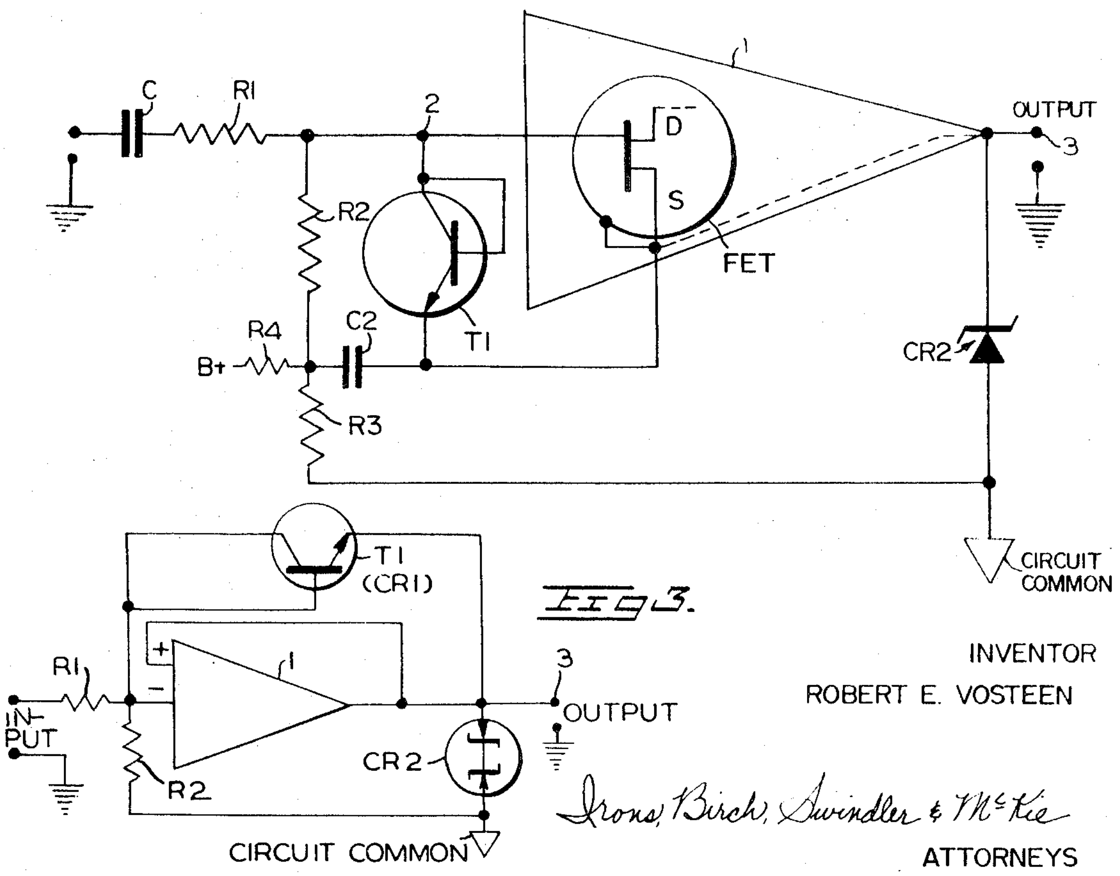
FIG. 2, FIG. 3.
INVENTOR
ROBERT E. VOSTEEN
Irons, Birch, Swindler & McKie
ATTORNEYS

OVERLOAD PROTECTION CIRCUIT FOR AMPLIFIER

BACKGROUND OF THE INVENTION

Field of the Invention

The invention relates to an overload protection circuit for an amplifier having high input impedance. It has particular utility in amplifiers functioning as voltage followers and those employing elements such as FET transistors.

SUMMARY OF THE INVENTION

The invention comprises an overload protection circuit utilizing zener diodes or elements having characteristics similar thereto. A first zener diode is connected between the input and output of the amplifier. A second zener diode is connected between the output of the amplifier and the circuit common line. The first and second diodes have their respective cathodes connected to the amplifier output.

Depending upon the overload to the amplifier input, the diodes are driven to either the forward-bias or reverse-bias conduction states to limit the amplifier to operational potentials that do not exceed the destruction potentials of elements associated therewith. The amplifier active input element may comprise an FET, for example.

The overload protection circuit according to the invention is particularly advantageous because of its relative noncomplexity and utilization of a minimum number of components. Further the substitution of transistors having zener diode characteristics for actual zener diodes is advantageous because the former are relatively less expensive and exhibit lower capacitance.

BRIEF DESCRIPTION OF THE DRAWINGS

FIG. 1 shows the overload protection circuit using zener diodes according to the invention;

FIG. 2 shows the overload protection circuit wherein a transistor element is substituted for one of the zener diodes of FIG. 1, according to the invention;

FIG. 3 is a modification of FIG. 2.

DETAILED DESCRIPTION OF THE INVENTION

FIG. 1 shows the overload protection device according to the invention. Amplifier 1 functions as a voltage follower having a very high input impedance. The input to amplifier 1 is coupled thereto by capacitor C and resistor R1. Capacitor C can be utilized if it is desired to decouple the DC potential bias supply of the amplifier from the input device. Resistor R1 functions as a protective resistor to protect the input element of the amplifier from a high voltage source input device.

The active input stage of the amplifier may comprise, for example, an FET transistor. It is known that an FET is subject to destruction should the input voltage to its gate exceed the destruction potential of the FET. Other types of active input elements may also be used that would be subject to destruction if the input voltage thereto exceeds its destruction potential.

The overload protection circuit comprises zener diode CR1 connected between the amplifier input terminal 2 and the amplifier output terminal 3. A second zener diode, CR2, is connected between amplifier output terminal 3 and the circuit common line. The cathodes of zener diodes CR1 and CR2 are connected to output terminal 3 of the amplifier, and their anodes are respectively connected to input terminal 2 and the circuit common line.

The output of the preamplifier is limited under overload conditions by zener diode CR2. Depending upon the polarity of the overload to the input, both zener diodes CR1 and CR2 may conduct either in forward biased manner, or in reverse biased manner. The latter may occur when voltages equal to or greater than their zener breakdown voltages are applied thereacross. Such conduction properties of zener diodes are of course conventionally known.

When such conduction occurs, the FET gate and output circuits, assuming the amplifier comprises an FET, are limited to potentials that are less than the destruction potential of the FET. The zener breakdown voltages are selected to secure this result. Diode CR1 thereby functions as a protective circuit to prevent destruction of the FET under overload conditions.

It is possible to replace zener diode CR1 with a transistor connected to function as a zener diode; that is the transistor may be connected to conduct in forward biased manner, or reverse biased manner (upon application of its "breakdown" potential), depending upon the polarity of the input overload to the amplifier.

FIG. 2 shows such an arrangement whereby an FET having a gate, a source S, and a drain D comprises the active input element of the amplifier. Transistor T1 is connected to have zener diode characteristics.

Its base is connected to its collector, and the common connection of the base and collector is connected to terminal 2. Its emitter is connected to source S of the FET, and to one plate of capacitor C2. Resistor R2 is connected between terminal 2 and the common connection of the other plate of capacitor C2, resistor R3, and resistor R4. R3 is connected between said common connection and the circuit common line. The DC bias supply B+ is connected to said common connection via R4. Otherwise the circuit is similar to that described with reference to FIG. 1.

The combination of resistor R4 and R3 functions as a voltage divider in association with the DC bias supply B+ and the circuit common line. Further, resistor R2 is a gate leak resistor for the FET, and is bootstrapped to an extremely high value by capacitor C2 connected to the amplifier output at source S of the FET.

Depending upon the polarity of the overload to the gate of the FET, transistor Q1 may conduct as a forward biased diode or as a zener diode. It thereby functions similarly to zener diode CR1 shown in FIG. 1. Further, zener diode CR2 performs the same function as the similarly designated zener diode of FIG. 1. The amplifier circuit elements connected between the FET and the amplifier output are not shown because they are not essential to an understanding of the invention and obviously would depend upon the particular amplifier characteristics desired.

Overload Protection Circuit

The amplifier may be considered as an adaptation of an operational amplifier with a differential input and a single ended output.

The amplifier is connected as a voltage follower by connecting its output back to its "plus input" (the source of the FET in FIG. 2). See FIG. 3.

This amplifier in the circumstance shown in FIG. 2 has its input positively biased as only AC operation is required and this procedure permits linear operation with a single polarity supply-positive in this instance.

The positive polarity supply could be replaced by a negative polarity supply thereby necessitating the reversal of the polarity of CR2 plus CR1 if an FET of opposite polarity is substituted.

In the event DC operation were required with the input biased at zero volts, the output protective device would become a double anode zener diode or two zener diodes connected in series opposition (See FIG. 3).

A most important feature of the protective circuit relates to its functioning with a voltage follower.

Assume for discussion, the operational amplifier has infinite input impedance and a voltage gain of greater than 1,000 at the frequency at which it is to be used.

If then connected as a voltage follower, it would possess a gain of greater than +0.999.

In this case, the effective loading referred to the input of the zener diode protective device connected between input and output would be reduced by a factor of greater than 1,000.

If therefore the zener connected transistor exhibited a resistance of $10^9$ ohms and a capacitance of 10 picofarads, it would appear at the amplifier input as a resistance of greater than $10^{12}$ ohms and a capacitance of less than 0.01 picofarads when the amplifier is functioning normally.

Considering the above numbers, it is obvious that the loading effect of the zener protective device during normal operation is negligible.

It will be evident that many minor changes may be made in the apparatus described herein, without departure from the scope of the invention. Accordingly, the invention is not to be considered limited by such description, but only by the scope of the appended claims.

What I claim is:

1. An overload protection circuit for use with a voltage follower having input and output circuits, to protect the input circuit of the voltage follower while having a negligible loading effect thereon comprising:

a first element having zener diode characteristics, connected between the input and output circuits of the voltage follower, a second element having zener diode characteristics connected between the output circuit of the voltage follower and a circuit common line of the voltage follower, a DC potential bias source connected to reverse bias the first and second elements, the first and second elements having zener breakdown voltages selected such that conduction of the first and second elements is effected in response to the polarity of the overload at the input circuit of the voltage follower, to limit the potentials at the voltage follower input and output circuits to values less than the destruction potentials of the voltage follower.

2. The voltage follower overload protection circuit recited in claim 1 wherein the first and second elements comprise zener diodes.

3. The voltage follower overload protection circuit recited in claim 1 wherein the first element comprises a transistor connected to function as a zener diode and the second element comprises a zener diode.

4. The overload protection circuit recited in claim 1 wherein the voltage follower further comprises an FET active input stage.

5. The overload protection circuit recited in claim 1 further comprising:

decoupling means operatively connected to the input of the voltage follower to block the DC potential bias of the voltage follower from devices connected to the input circuit of the voltage follower.

6. The overload protection circuit recited in claim 1 further comprising impedance means connected to the input circuit of the voltage follower to limit the magnitude of signals applied to the input circuit.

7. The overload protection circuit recited in claim 6 further comprising:

decoupling means operatively connected to the input of the voltage follower to block the DC potential bias of the voltage follower from devices connected to the input circuit of the voltage follower.

8. The overload protection circuit recited in claim 1 wherein corresponding electrodes of the first and second elements are connected to the voltage follower output circuit.

9. The overload protection circuit recited in claim 2 wherein corresponding electrodes of the first and second zener diodes are connected to the voltage follower output circuit.

10. The overload protection circuit recited in claim 9 wherein the cathodes of the first and second zener diodes are connected to the voltage follower output circuit.